US010313609B2

(12) United States Patent
Fu et al.

(10) Patent No.: US 10,313,609 B2
(45) Date of Patent: Jun. 4, 2019

(54) IMAGE SENSORS HAVING PIXEL-BINNING WITH CONFIGURABLE SHARED FLOATING DIFFUSION

(71) Applicant: QUALCOMM Incorporated, San Diego, CA (US)

(72) Inventors: Zhengming Fu, Austin, TX (US); Soo Youn Kim, San Diego, CA (US); Jan Christian Huber, Bee Cave, TX (US)

(73) Assignee: QUALCOMM Incorporated, San Diego, CA (US)

( * ) Notice: Subject to any disclaimer, the term of this patent is extended or adjusted under 35 U.S.C. 154(b) by 95 days.

(21) Appl. No.: 15/264,431

(22) Filed: Sep. 13, 2016

(65) Prior Publication Data

US 2017/0302865 A1    Oct. 19, 2017

Related U.S. Application Data

(60) Provisional application No. 62/322,699, filed on Apr. 14, 2016.

(51) Int. Cl.
*H04N 5/347* (2011.01)
*H04N 5/355* (2011.01)
(Continued)

(52) U.S. Cl.
CPC ....... *H04N 5/347* (2013.01); *H01L 27/14612* (2013.01); *H01L 27/14621* (2013.01);
(Continued)

(58) Field of Classification Search
CPC ...... H04N 5/347; H04N 5/3745; H04N 5/374; H04N 5/3559; H01L 27/14665;
(Continued)

(56) References Cited

U.S. PATENT DOCUMENTS 6,888,122 B2 * 5/2005 Fossum ............ H01L 27/14609
250/208.1
2004/0135063 A1   7/2004 Dosluoglu
(Continued)

FOREIGN PATENT DOCUMENTS

DE    102008052930 A1    4/2010
WO      2011053711 A1    5/2011

OTHER PUBLICATIONS

Suarez M., et al., "CMOS-3D Smart Imager Architectures for Feature Detection", IEEE Journal on Emerging and Selected Topics in Circuits and Systems, IEEE, Piscataway, NJ, USA, vol. 2, No. 4, Dec. 1, 2012 (Dec. 1, 2012), pp. 723-736, XP011479510, ISSN: 2156-3357, DOI: 10.1109/JETCAS.2012.2223552.
(Continued)

*Primary Examiner* — Jason A Flohre
(74) *Attorney, Agent, or Firm* — Kilpatrick Townsend & Stockton (57) ABSTRACT

Methods, systems, computer-readable media, and apparatuses for image sensors with pixel binning with configurable shared floating diffusion are presented. In one example, an image sensor system includes a plurality of sensor elements; a photo-sensitive layer coupled to the plurality of sensor elements; a plurality of floating diffusion regions in communication with the photo-sensitive layer, each floating diffusion region of the plurality of floating diffusion regions configured to be selectively enabled; and at least one bridge coupled to two floating diffusion regions of the plurality of floating diffusion regions, the bridge configured to be selectively enabled and, when enabled, to allow a transfer of charge between the two floating diffusion regions.

22 Claims, 11 Drawing Sheets

(51) Int. Cl.
*H04N 5/374* (2011.01)
*H01L 27/146* (2006.01)
*H04N 5/3745* (2011.01)

(52) U.S. Cl.
CPC .. *H01L 27/14625* (2013.01); *H01L 27/14638* (2013.01); *H01L 27/14641* (2013.01); *H01L 27/14643* (2013.01); *H01L 27/14665* (2013.01); *H04N 5/3559* (2013.01); *H04N 5/374* (2013.01); *H04N 5/3745* (2013.01)

(58) Field of Classification Search
CPC ......... H01L 27/14641; H01L 27/14643; H01L 27/14638; H01L 27/14625; H01L 27/14621; H01L 27/14612
See application file for complete search history.

(56) References Cited

U.S. PATENT DOCUMENTS

| | | | |
|---|---|---|---|
| 2005/0012836 A1 | 1/2005 | Guidash | |
| 2006/0274176 A1* | 12/2006 | Guidash | H04N 5/347 348/300 |
| 2008/0062290 A1 | 3/2008 | Lahav et al. | |
| 2009/0066782 A1 | 3/2009 | Choi et al. | |
| 2009/0153716 A1* | 6/2009 | Ota | H04N 5/3575 348/308 |
| 2010/0118167 A1 | 5/2010 | Johnson | |
| 2010/0182465 A1* | 7/2010 | Okita | H04N 5/343 348/273 |
| 2010/0210903 A1* | 8/2010 | Ishihara | H04N 5/347 600/109 |
| 2010/0328505 A1* | 12/2010 | Imamura | H04N 5/347 348/273 |
| 2011/0019051 A1 | 1/2011 | Yin et al. | |
| 2011/0101205 A1* | 5/2011 | Tian | H04N 5/332 250/208.1 |
| 2012/0188427 A1* | 7/2012 | Solhusvik | H04N 5/3559 348/300 |
| 2012/0262616 A1* | 10/2012 | Sa | H04N 5/35527 348/311 |
| 2013/0021441 A1 | 1/2013 | Kim | |
| 2013/0314574 A1* | 11/2013 | Ishii | H01L 27/1461 348/302 |
| 2014/0118592 A1 | 5/2014 | Yoon et al. | |
| 2014/0218580 A1 | 8/2014 | Mayer et al. | |
| 2014/0226046 A1 | 8/2014 | Lahav et al. | |
| 2015/0350582 A1 | 12/2015 | Korobov et al. | |
| 2016/0037117 A1* | 2/2016 | Ono | H04N 5/3745 348/308 |
| 2016/0105624 A1* | 4/2016 | Handa | H04N 5/37457 348/303 |
| 2016/0337567 A1* | 11/2016 | Okura | H04N 5/2327 |
| 2017/0064211 A1 | 3/2017 | Omid-Zohoor | |
| 2017/0302866 A1 | 10/2017 | Fu et al. | |
| 2018/0027192 A1* | 1/2018 | Morisaki | H04N 5/347 |

OTHER PUBLICATIONS

International Search Report and Written Opinion—PCT/US2017/021569—ISA/EPO—dated Aug. 9, 2017.
International Search Report and Written Opinion—PCT/US2017/022039—ISA/EPO—dated Jun. 1, 2017.

\* cited by examiner

IMAGE SENSORS HAVING PIXEL-BINNING WITH CONFIGURABLE SHARED FLOATING DIFFUSION

CROSS-REFERNCE TO RELATED APPLICATIONS

This application claims the benefit of U.S. Provisional Application No. 62/322,699, filed Apr. 14, 2016, entitled "Image Sensors Having Pixel-Binning with Configurable Shared Floating Diffusion" which is incorporated herein by reference in its entirety.

BACKGROUND

Image sensors are used in various applications (in-vehicle, surveillance, medical, and so on), and high quality image sensors can be desirable. One type of image sensor that can produce high-quality images is a CMOS image sensor laminated by photo-sensitive layer material, such as organic photoconductive film (OPF) or quantum dot film ("QDF").

BRIEF SUMMARY

Various examples are described for image sensors having pixel-binning with configurable shared floating diffusion. For example, one example image sensor system includes a plurality of sensor elements; a photo-sensitive layer coupled to the plurality of sensor elements; a plurality of floating diffusion regions in communication with the photo-sensitive layer, each floating diffusion region of the plurality of floating diffusion regions configured to be selectively enabled; and one or more bridges coupled to two floating diffusion regions of the plurality of floating diffusion regions, the one or more bridges configured to be selectively enabled and, when enabled, to allow a transfer of charge between the two floating diffusion regions.

One example method includes enabling a pixel binning configuration in an image sensor; measuring a sampled indication of charge at one or more enabled floating diffusion regions; comparing the sampled indication of charge to a threshold; and responsive to determining the sampled indication of charge exceeds the threshold, enabling one or more bridges associated with one or more of the enabled floating diffusion regions.

One example image sensor system includes a plurality of means for receiving light; means for releasing electrons in response to receiving photons coupled to the means for receiving light; a plurality of means for accumulating electric charge coupled to the means for releasing electrons; and means for selectively electrically coupling two means for accumulating electric charge to allow a transfer of charge between the two means for accumulating electric charge.

One example non-transitory computer-readable medium of claim 18, wherein a bridged enabled floating diffusion region and a disabled floating diffusion region form a shared floating diffusion region, and further comprising: measuring an shared sampled indication of charge at one or more shared enabled floating diffusion regions; comparing the shared sampled indication of charge to a threshold; and responsive to determining the shared sampled indication of charge exceeds the threshold, enabling one or more bridges associated with one or more of the shared floating diffusion regions to a further disabled floating diffusion region such that the shared floating diffusion region comprises an enabled floating diffusion region and at least two disabled floating diffusion regions.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

DETAILED DESCRIPTION

Examples are described herein in the context of image sensors having pixel-binning with configurable shared floating diffusion. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Some image sensors use materials that generate electrons in response to incident photons. The generated charge can be accumulated (with or without a multiplication step), and then a signal indicative of the amount of accumulated charge can be read. Materials such as OPF and QDF can be used to generate charge from incident light, and charge accumulation regions such as floating diffusion regions can be read using sampling circuitry. Many image sensors are arranged as rows and columns of sensor elements, where each sensor element covers an area of the image sensor. A sensor element can include an optical element such as a microlens and a color filter in optical communication with a charge generating material such as an OPF layer.

In one design, each sensor element can be associated with a charge accumulation region, and subsequent reading of voltage (or other indication of accumulated charge) in the accumulation region will provide information indicative of the incident light on that sensor element. Techniques describe below allow for the charge accumulation region associated with one sensor element to accumulate charge from a plurality of sensor elements, while the charge accumulation regions of the others of the plurality of sensor elements are disabled. In addition, in some examples one or more bridges may be enabled to electrically coupled an enabled charge accumulation region with one or more disabled charge accumulation regions to provide a combined charge accumulation region.

Figure 1A:
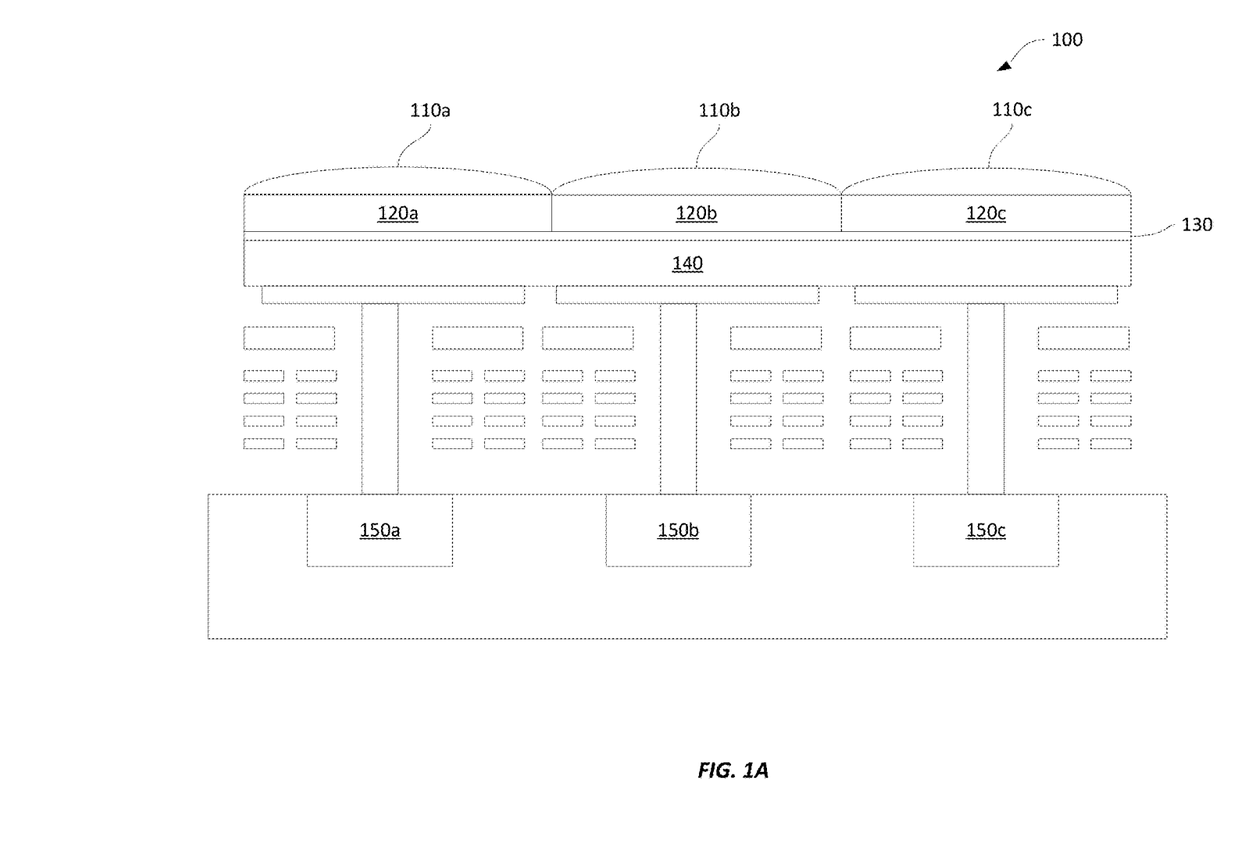
FIGS. 1A-1D an example CMOS image sensor laminated by photo-sensitive layer material, such as OPF or QDF.

Referring to FIG. 1A, FIG. 1A shows an example OPF CMOS sensor 100. The sensor 100 includes an array of abutted sensor elements that include micro lenses 110a-c and color filters 120a-c positioned above a planarization layer 130. These components are disposed on a photo-sensitive layer, such as an OPF layer, 140, each coupled to a charge accumulation region 150a-c, which may be, for example, floating diffusion regions, which represent a diffusion capacitor in a silicon layer that can be charged with the electrons released from the OPF layer. And while this example references an OPF layer, other suitable sensor photo-sensitive lamination material technologies may be used as well, such as a QDF that may be laminated in image sensors. Photons received by the photo-sensitive layer generate the release of electrons in the photo-sensitive layer, e.g., OPF layer 140, which then travel into the floating diffusion regions 150a-c, where the electron charge is accumulated. Accumulated charge for each sensor element can then be sampled and converted from analog signal to digital value to determine a corresponding light intensity value. This process can be seen in more detail in FIGS. 1B-1D.

Figure 1B:
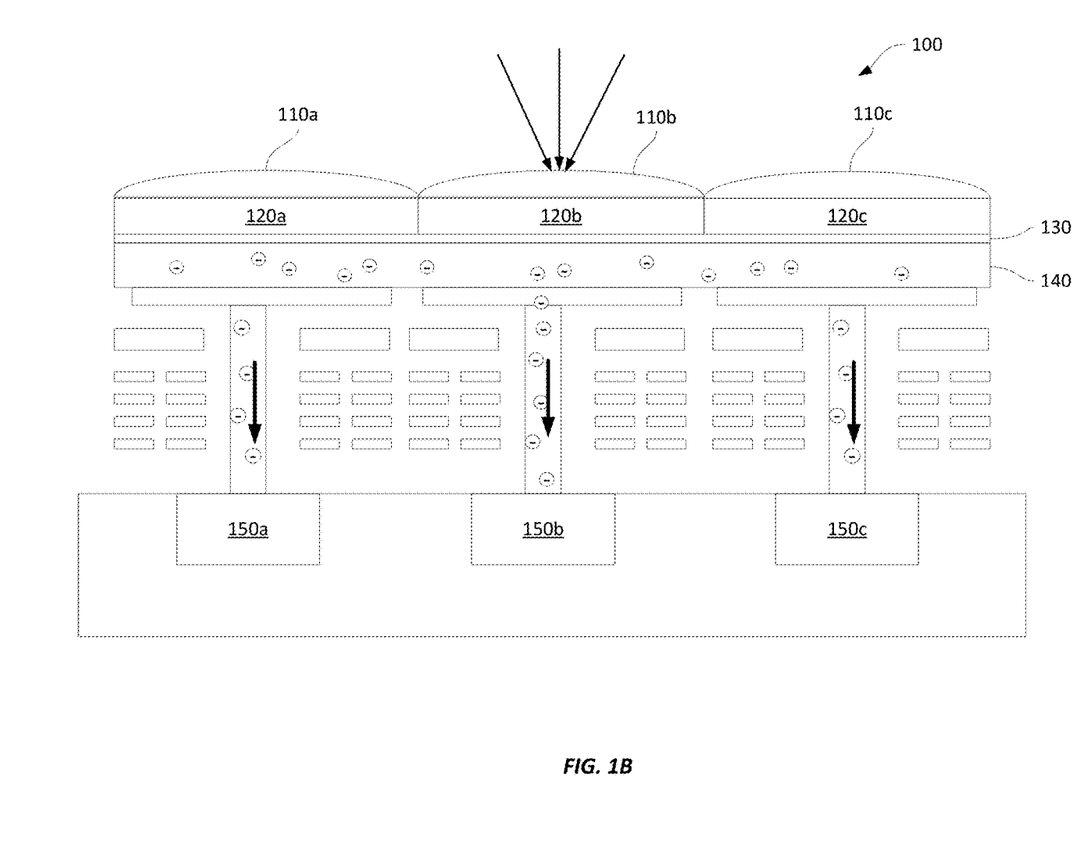

In FIG. 1B, the OPF layer 140 is charged to a predetermined voltage, e.g., 10 volts or any appropriate voltage. After which, projecting light onto the pixel elements of the sensor 100 will result in output signals that can be read from the floating diffusion regions 150a-c to obtain image information. More specifically, photons projected onto the pixel elements, passing through micro lenses 110a-c and the corresponding color filters 120a-c are focused on the OPF layer 140. Within the OPF layer 140, received photons cause the release of electrons, which travel to the floating diffusion regions 150a-c residing in the silicon base layer corresponding to the respective micro lens 110a-c and color filter 120a-c above. The accumulation of electrons in the floating diffusion regions 150a-c, which is linearly correlated with light projected on the corresponding pixel element creates an electric charge level that corresponds to a voltage proportional to the number of electrons accumulated in each floating diffusion region 150a-c.

Figure 1C:
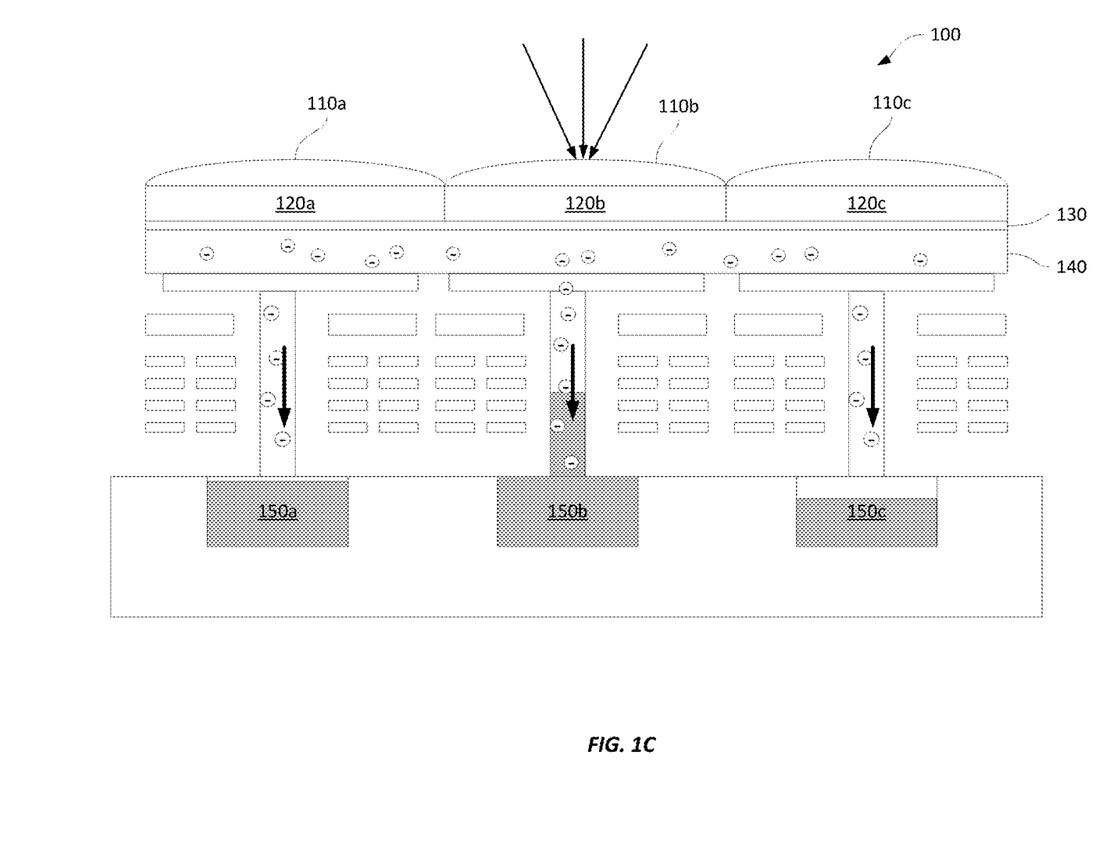

Referring to FIG. 1C, over time, the accumulation of electrons increases the charge within each floating diffusion regions 150a-c, which is illustrated based on the amount of shading in each floating diffusion region 150a-c. For example, the right-most floating diffusion region 150c is only partially saturated with charge, the left-most floating diffusion region 150a is nearly saturated with charge, and the center floating diffusion region 150b is over-saturated with charge. As discussed above, the respective amounts of accumulated charge are proportional to the respective number of accumulated electrons, which in turn are proportional to the number of photons that struck the sensor 100.

Figure 1D:
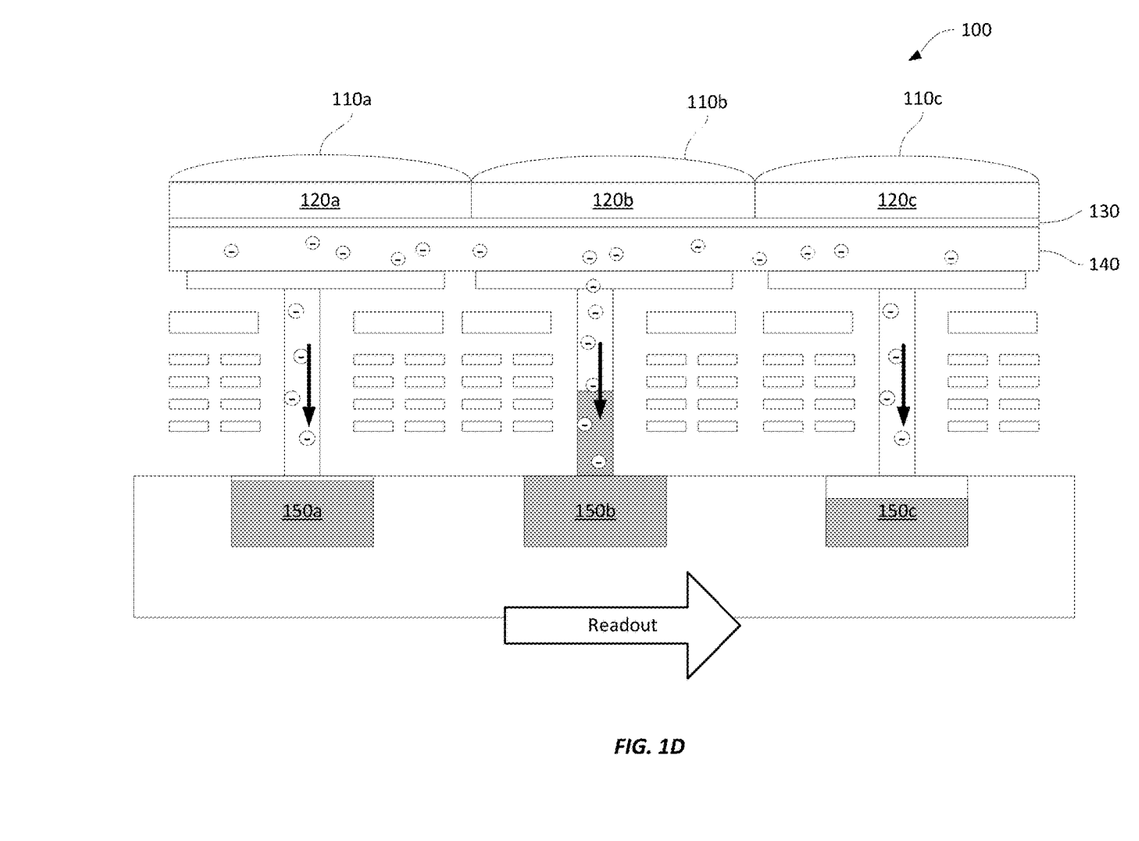

Referring to FIG. 1D, the accumulated charge from each floating diffusion region will be read using a sampling circuit, including an amplifier to obtain and amplify the signal from the respective floating diffusion region, to determine the accumulated charge, which indicates the amount of photons received at a particular location, e.g., pixel element, on the sensor. This accumulated charge can then be sampled, converted from analog voltage to digital value used to generate a corresponding pixel value, such as a light intensity or a color value.

The basic photo-sensitive layer, e.g., OPF or QDF, laminated CMOS sensor shown in FIGS. 1A-1D can be enhanced with additional features that may be of value in different scenarios. One such feature is referred to as "pixel-binning." Referring again to FIG. 1B, as can be seen in the OPF sensor 100, within each pixel element, each micro lens 110a-c and color filter 120a-c has a corresponding floating diffusion region 150a-c beneath it. Thus, photons that strike the left-most micro lens 110a generally proceed through the corresponding color filter 120a, are focused onto the photo-sensitive layer by pixel elements, and released electrons primarily travel into the corresponding floating diffusion region 150a. Pixel-binning, by contrast, disables one or more floating diffusion regions 150a-c, thereby diverting released electrons from neighboring pixel elements to a common active floating diffusion region shared by neighboring basic pixel elements. For example, the image sensor 100 shown in FIG. 1B could be configured such that electrons released based on photons striking any of micro lenses 110a-c and color filters 120a-c of those pixel elements travel into the center floating diffusion region 150b by disabling floating diffusion regions 150a and 150c. By doing so, the resolution of the image sensor decreases, because the number of floating diffusion regions is reduced and electrons converge into the same active floating diffusion of the shared pixel elements, however, some applications, such as motion detection or security surveillance, may not require high resolution images until a special event or alarm occurs, and in some cases may reduce resolution that results in power-saving benefits for system operation.

Figure 2A:
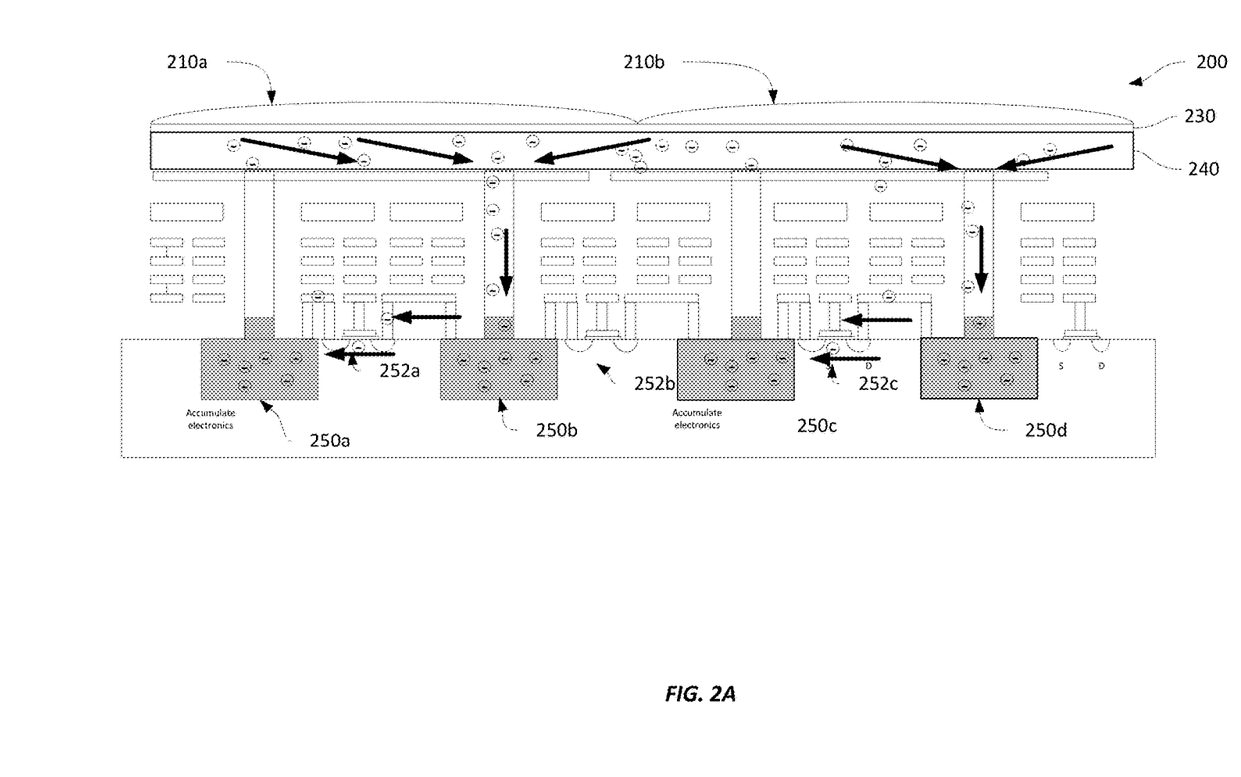
FIGS. 2A-C shows an example image sensor for pixel-binning with configurable shared floating diffusion.
Figure 2B:
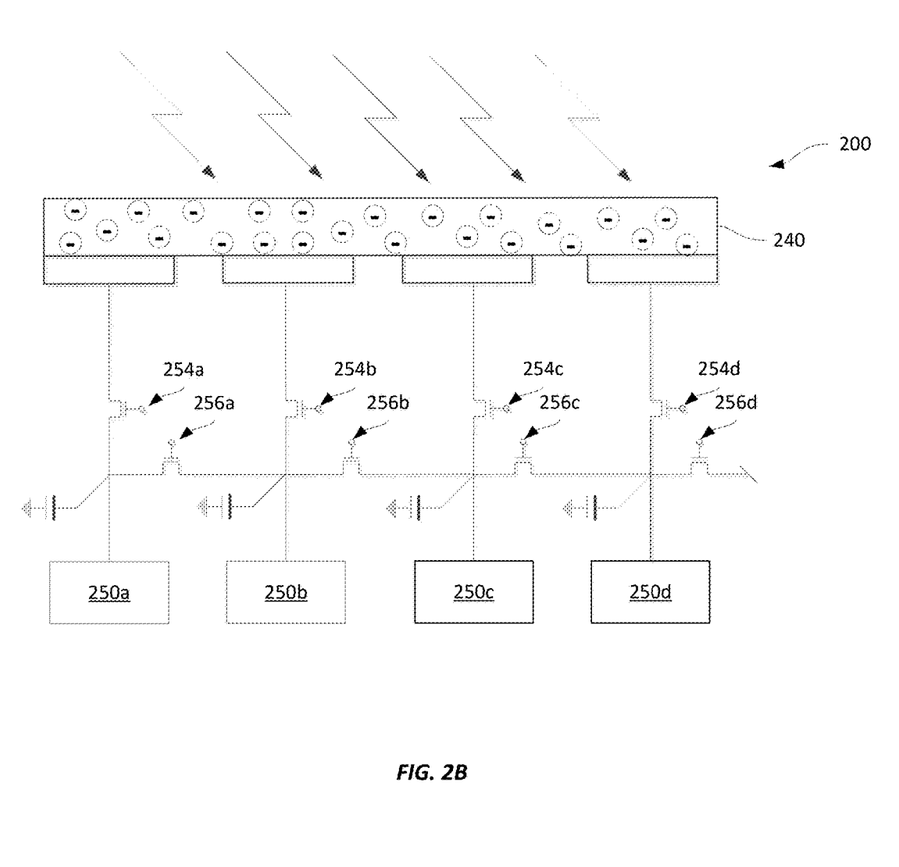
Figure 2C:
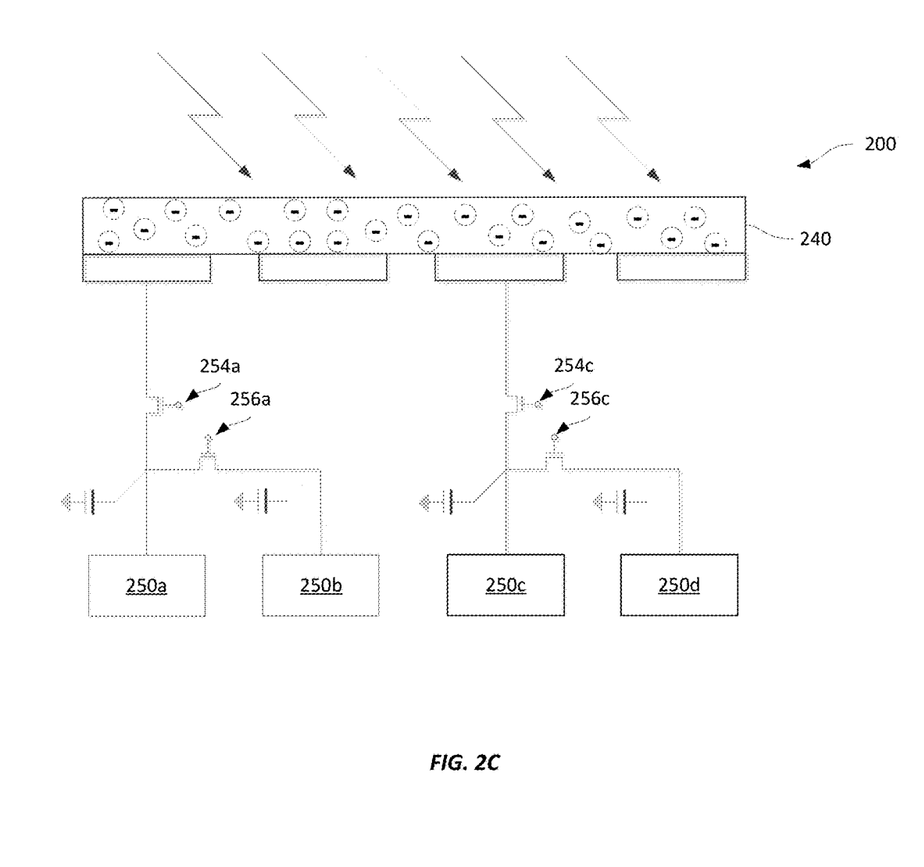

Referring now to FIG. 2A-2C, FIG. 2A shows an example image sensor with pixel-binning with configurable shared floating diffusion. The image sensor 200 shown in FIG. 2A is an OPF laminated CMOS image sensor, though, other types of image sensors may be employed instead, such as QDF laminated CMOS image sensors.

The image sensor 200 shown in FIG. 2A includes several micro-lenses 210a-c, an OPF laminated layer 220 and several floating diffusion regions 250a-c. In addition, the image sensor 200 includes bridge CMOS devices 252a-b. While this example does not include color filters, such as those shown in the image sensor 100 of FIGS. 1A-1D, such filters, or other components, may be incorporated into different example image sensors according to this disclosure.

The micro-lenses 210a-c, OPF layer 220, and floating diffusion regions 250a-c operate as discussed above with respect to FIGS. 1A-1D. Further, the image sensor is configured to perform pixel-binning, where floating diffusion regions 250a and 250c have been disabled, thereby routing electrons released by photons captured via micro-lenses 210a-c and the photo-sensitive layer 240 into the center floating diffusion region 250b. FIG. 2A illustrates the pixel-binning by the arrows indicating the travel of electrons to floating diffusion region 250b.

In some examples, pixel binning in this manner, particularly when using a photo-sensitive layer 240, e.g., an OPF film or other means for releasing electrons in response to receiving photons, may enable greater image sensor 200 sensitivity in low light conditions. For example, as can be seen in FIG. 2A, even though floating diffusion region 250a is disabled, electrons released in the photo-sensitive layer 240 in a portion of the sensor corresponding to the floating diffusion region 250a are still able to travel to another nearby floating diffusion region, e.g., floating diffusion region 250*b*. Similarly, when floating diffusion region 250*c* is disabled, electrons released in the photo-sensitive layer 240 in an area corresponding to floating diffusion region 250*c* are able to travel to either of floating diffusion regions 250*b* or 250*d*. Thus, while floating diffusion regions may be decoupled from the photo-sensitive layer 240, the entire photo-sensitive layer 240 may remain enabled and continue to generate electrons that are able to flow to nearby available floating diffusion regions. Thus, the sensitivity of the sensor 100 may not be degraded by disabling floating diffusion regions. In fact, in some examples, the sensitivity of the sensor 100 may increase due to combined electrons from neighboring pixel elements travelling into a smaller number of active floating diffusion regions when some of the other floating diffusion regions are disabled. However, it should be noted that all electrons released from a portion of the photo-sensitive layer 240 corresponding to a disabled floating diffusion region will not necessarily travel to the same active floating diffusion regions. Instead, such electrons may travel to any available active floating diffusion region, or may not even leave the photo-sensitive layer in some cases.

In addition to enabling pixel binning, the sensor 100 includes bridge CMOS devices 252*a-c* or other means for selectively electrically coupling two floating diffusion regions or other means for accumulating charge. Bridge CMOS devices 252*a-c* are configured to selectively allow accumulated electrons in floating diffusion region 250*b* to travel into neighboring floating diffusion regions 250*a*, 250*c*. For example, if bridge 252*a* is enabled, some of the electrons accumulating in floating diffusion region 250*b* are able to traverse the bridge 252*a* and accumulate in floating diffusion region 250*a* simultaneously with floating diffusion region 250*b*. Similarly, if bridge 252*c* is enabled, some of the electrons accumulating in floating diffusion region 250*d* are able to traverse the bridge 252*c* and accumulate in floating diffusion region 250*c*.

By enabling one or more bridges 252*a-c*, the image sensor 200 is able to effectively increase the amount of charge that a floating diffusion region 250*b* can accumulate. Again, in a pixel binning operation, one floating diffusion region accumulates charges from multiple photon collection elements, e.g., micro lenses, color filters, and photo-sensitive layer. In a bright environment when using a pixel binning configuration, it may be that electrons that accumulate in a single floating diffusion region arrive at a higher rate than in a non-binning configuration. Thus, the capacity of a floating diffusion region may be exceeded based on the rate at which electrons are released by incoming photons, and electron saturation may occur.

However, because pixel binning may be employed, other floating diffusion regions stand disabled, e.g., when the image sensor 200 uses pixel binning to accumulate charge in floating diffusion region 250*b*, floating diffusion regions 250*a* and 250*c* are disabled and do not accumulate charge. But by enabling one or both of bridges 252*a*, *b*, the capacity of floating diffusion region 250*b* effectively can be increased by the capacity of either, or both, of floating diffusion regions 250*a* or 250*c*. When the floating diffusion charges are later read, the combined readings from 250*b* and either, or both, of 250*a* and 250*c* can be read as a single value corresponding to, e.g., the intensity value, for the entire binned group of sensor elements. In this context, a sensor element, or other means for collecting light refers to a micro lens cell or, in some examples, a micro lens cell and a corresponding color filter cell, or other discrete element through which photons are received and provided to an OPF or similar photo-sensitive layer in which photons are used to release electrons to a floating diffusion region.

Further, in the example shown in FIG. 2A, the bridges 252*a*, *b* may be individually and dynamically enabled or disabled. Thus, the effective capacity of floating diffusion region 250*b* can be dynamically configured, such as to accommodate changing operational requirements for the image sensor 200. For example, in a low light setting, the bridges 252*a*, *b* may be disabled as the amount of electron charge that will likely accumulate in the center floating diffusion region 250*b* is sufficiently small that the capacity of the floating diffusion region 250*b* is sufficient to store the charge until the next time the amount of charge is read. However, in a bright setting, one or both bridges 252*a*, *b* may be enabled as the center floating diffusion region 250*b* may quickly reach capacity due to the larger number of photons reaching the binned sensor elements, thereby causing a faster accumulation of charge in the floating diffusion region 250*b*, and in some examples, charge saturation.

It should be noted that while the image sensor 200 shown in FIG. 2A only includes three sensor elements, example image sensors according to this disclosure may include many more sensor elements. For example, some image sensors according to this disclosure may include hundreds, thousands, or millions of sensor elements arranged in any suitable arrangement, including a two-dimensional array. In one example, an image sensor may include a number of sensor elements arranged in a two dimensional array having 1024 sensor elements per row and having 768 rows. However, still other arrangements and numbers of sensor elements may be employed.

Further, bridges 252*a-c* may be incorporated into one or more example sensors according to any predetermined configuration that may be desired. For example, each floating diffusion region may be coupled by a bridge to every other adjacent floating diffusion region in one example. In another example, each floating diffusion region may be coupled by bridges to adjacent floating diffusion regions in the same row or column in an example having a two-dimensional array of sensor elements. Further, while the example shown in FIG. 2A shows only that the center floating diffusion region 250*b* is coupled to two floating diffusion regions 250*a, c* that are immediately adjacent to it, in some examples, a first floating diffusion region may be coupled by a bridge to an adjacent, second floating diffusion region, which in turn may be coupled to a third floating diffusion region that is adjacent to the second floating diffusion region, but is not adjacent to the first floating diffusion region, such that the accumulation of charge in the first floating diffusion region traverses the bridge to the second floating diffusion region and then to the third floating diffusion region. In various examples, the configuration of the bridge devices may be internal or external to the image sensor, or may be configured, e.g., enabled or disabled, automatically or manually, e.g., based on sensed ambient light in an environment or based on user preferences. Still further configurations may be possible in different examples.

Referring now to FIG. 2B-2C, FIGS. 2B-2C show the example sensor of FIG. 2A represented in a circuit diagram. In FIG. 2B, the bridges 252*a-c* comprise transistors 256*a-c*, respectively. Transistor 256*d* illustrates a portion of a bridge to a further floating diffusion region not shown in FIGS. 2A-2B. As can be seen in FIG. 2B, each floating diffusion regions 250*a-d* may be individually, selectively coupled to the photo-sensitive layer 240 via a transistor 254*a-d*. Further, the bridges 252*a-c* shown in FIG. 2A may be individually, selectively enabled by activating one or more of transistors 256a-c. Thus, by gating off any of transistors 254a-d, any or all of the floating diffusion regions 250a-d may be decoupled from the photo-sensitive layer 240, thereby effectively disabling the respective floating diffusion region 250a-d.

However, by activating one or more of the bridges 252a-c, by activating the corresponding transistor 256a-c, a "disabled" floating diffusion region may be bridged to accumulate charge from another floating diffusion region. FIG. 2C shows an example configuration of the sensor 200 in which two floating diffusion regions 250b, d have been "disabled" by gating off transistors 254b and 254d (not shown in FIG. 2C). In addition, bridges 252a and 252c have been enabled to couple floating diffusion region 250a to floating diffusion region 250b, and to couple floating diffusion region 250c to floating diffusion region 250d. In such a configuration, electrons released in the photo-sensitive layer 240 may travel to floating diffusion regions 250a or 250c, and then may traverse the corresponding bridge 252a or 252c to floating diffusion region 250b or 250d, respectively. By "binning" different light sensor elements into a common floating diffusion region, the sensitivity of the sensor 200 may be increased. Further, by sharing floating diffusion regions using the bridges 252a, 252c, the sensor is provided with a greater operational range because, e.g., the combined accumulated charge of floating diffusion regions 250a and 250b is read as a single intensity value.

In addition, because the sensor 200 is configured to provide a fully and individually-configurable pixel-binning and shared floating diffusion features, the entire sensor can be configured with any arbitrary pixel-binning configuration or shared floating diffusion configuration depending on the application. Further, because decoupling a portion of the photo-sensitive layer 240 from a corresponding floating diffusion region may not reduce the number of electrons available to be transferred to other active floating diffusion regions, the sensitivity of the sensor 200 may not be degraded by disabling one or more floating diffusion regions. Thus, the sensor 200 may retain its full sensitivity, or nearly full sensitivity, in low light conditions, though at a reduced resolution. Further, by employing pixel binning alone, or pixel-binning and shared floating diffusion, the sensor's performance in low-light environments may be enhanced from a state in which all floating diffusion regions are enabled as a greater number of electrons may be routed to a fewer number of active floating diffusion regions. Further, a voltage sensitivity level based on stored charge may be enhanced due to smaller floating diffusion capacitance.

In some examples, an image sensor design may restrict the number of bridges that may be employed. For example, some example image sensors may be designed to only provide one bridge coupled to each floating diffusion region such that two floating diffusion regions are connected by one bridge, and do not have bridges to any other floating diffusion regions. However, in some examples, each floating diffusion region may be coupled to multiple other floating diffusion regions by bridges, e.g., as shown in FIG. 2B.

Figure 3:
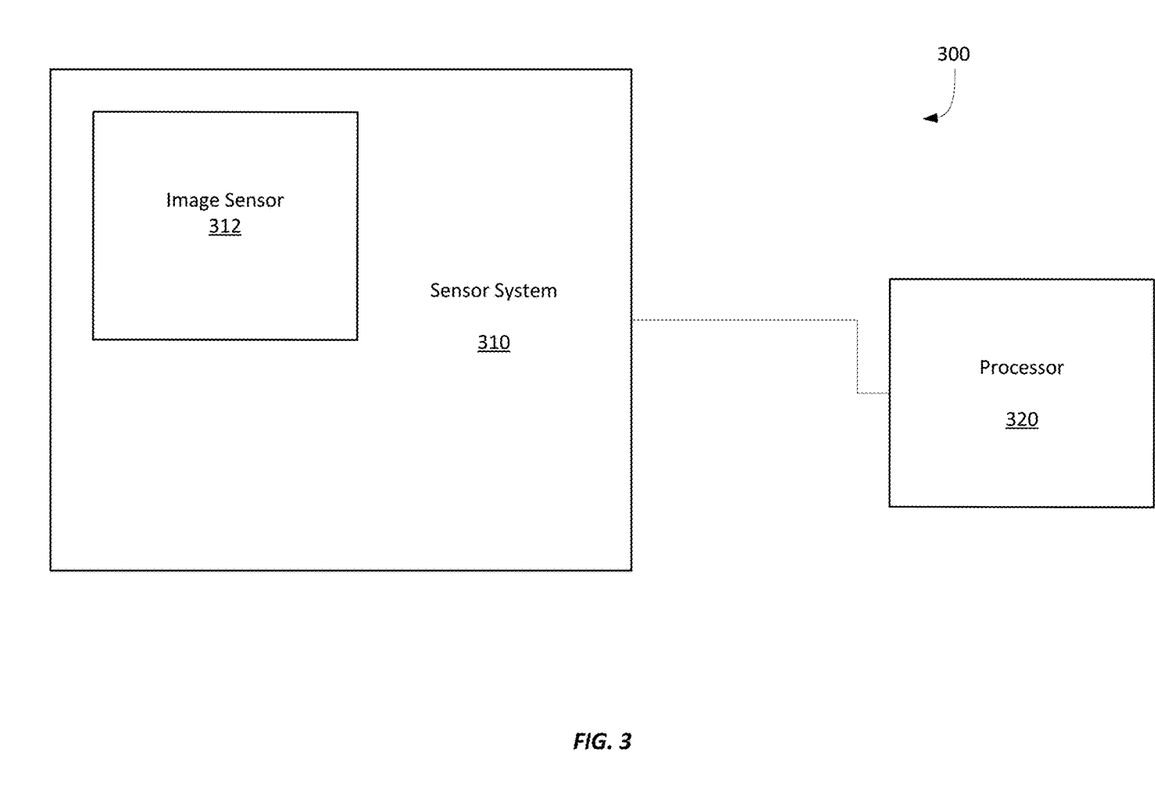
FIG. 3 shows an example system for pixel-binning with configurable shared floating diffusion.

Referring now to FIG. 3, FIG. 3 shows an example system 300 for pixel-binning with configurable shared floating diffusion. The system 300 includes a processor 320 in communication with an image sensor system 310. The image sensor system 310 includes an image sensor 312, such as the image sensor 200 shown in FIGS. 2A-C. The processor 320 is configured to transmit signals to the sensor system 310 to enable or disable the sensor system 310, to change a sensing mode of the sensor system 310, or to initiate a capture of one or more images. The sensor system 310 is configured to receive signals from the processor 320 and to control the image sensor 312. In some examples, the processor 320 could be a separate device, it could be embedded in the same packaging as the image sensor, or it could embedded on the same silicon device as the image sensor system 310. For example, the sensor system 310 may be configured to provide a voltage to a photo-sensitive layer, or to read accumulated charges from one or more floating diffusion regions within the image sensor 312.

In this example, the sensor system 310 is also configured to enable or disable pixel binning in the image sensor 312, and to activate one or more bridges 252a-c within the image sensor 312. The sensor system 310 is further configured to receive one or more sensor signals from the image sensor 312 associated with readings of accumulated charges within various floating diffusion regions within the image sensor 312, and to provide sensor information to the processor 320. For example, sensor information may include charge information, such as the detected charge in some or all of the floating diffusion regions of the image sensor 312, pixel information based on charge information read from the image sensor, a signal indicating whether motion was detected or not, or other information.

In this example, the processor 320 comprises a computer-readable medium, such as a random access memory (RAM) coupled to the processor. The processor 320 executes computer-executable program instructions stored in memory. Suitable example processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices. Processor is used herein according to its structural meaning, and not to denote software per se. The processor may include on-board memory, and may execute instructions stored in on-board memory, a separate memory, or a combination.

Example devices according to this disclosure that employ processors may comprise, or may be in communication with, media, for example computer-readable storage media, that may store instructions that, when executed by the processor, can cause the processor to perform the steps described herein as carried out, or assisted, by a processor. Examples of computer-readable media may include, but are not limited to, an electronic, optical, magnetic, or other storage device capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code for carrying out one or more of the methods (or parts of methods) described herein.

Figure 4:
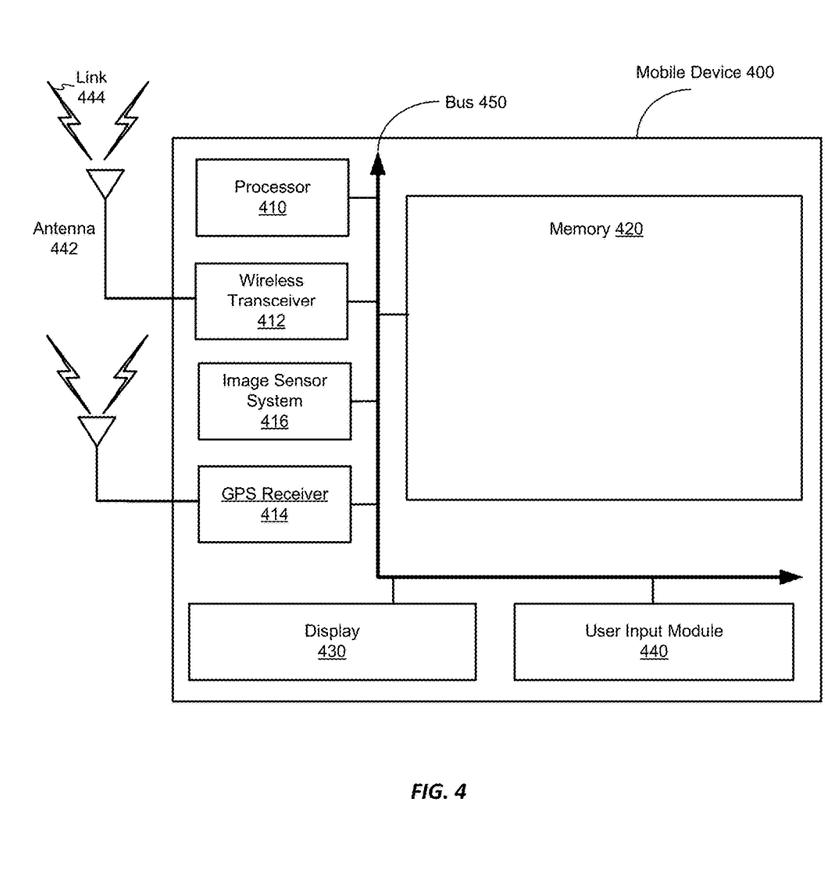
FIG. 4 shows an example mobile wireless device having an image sensor for pixel-binning with configurable shared floating diffusion.

Referring now to FIG. 4, FIG. 4 shows an example mobile wireless device 400 having an image sensor for pixel-binning with configurable shared floating diffusion. In the example shown in FIG. 4, the mobile device includes a processor 410, a memory 420, a wireless transceiver 412, a Global Navigation Satellite System (GNSS) 414, such as a Global Positioning System (GPS) receiver, an image sensor system 416, a display 430, a user input module 440, and a bus 450. In this example, the mobile device comprises a cellular smartphone, but may be any suitable device, include a cellular phone, a laptop computer, a tablet, a phablet, a personal digital assistant (PDA), wearable device, or augmented reality device. The processor 410 is configured to employ bus 450 to execute program code stored in memory 420, to output display signals to a display 430, and to receive input from the user input module 440. In addition, the processor 410 is configured to receive information from the GPS receiver 414 and wireless transceiver 412 and to transmit information to the wireless transceiver 412. The wireless transceiver 412 is configured to transmit and receive wireless signals via antenna 442 using link 444. For example, the wireless transceiver may be configured to communicate with a cellular base station by transmitting signals to and receiving signals from an antenna associated with the cellular base station. The GPS receiver 414 is configured to receive signals from one or more GPS satellites and to provide location signals to the processor 410. In this example, the image sensor system 416 comprises an image sensor system, such as the sensor system 310 shown in FIG. 3; however, the image sensor system 416 may be any suitable image sensor system.

Further, it should be appreciated that various implementation options may be available in accordance with specific requirements in applications. For example, a customized hardware in the same wafer or die of the silicon sensor might also be used, or particular elements might be implemented in customized hardware, software or both, to replace the processor in the FIG. 4.

Figure 5:
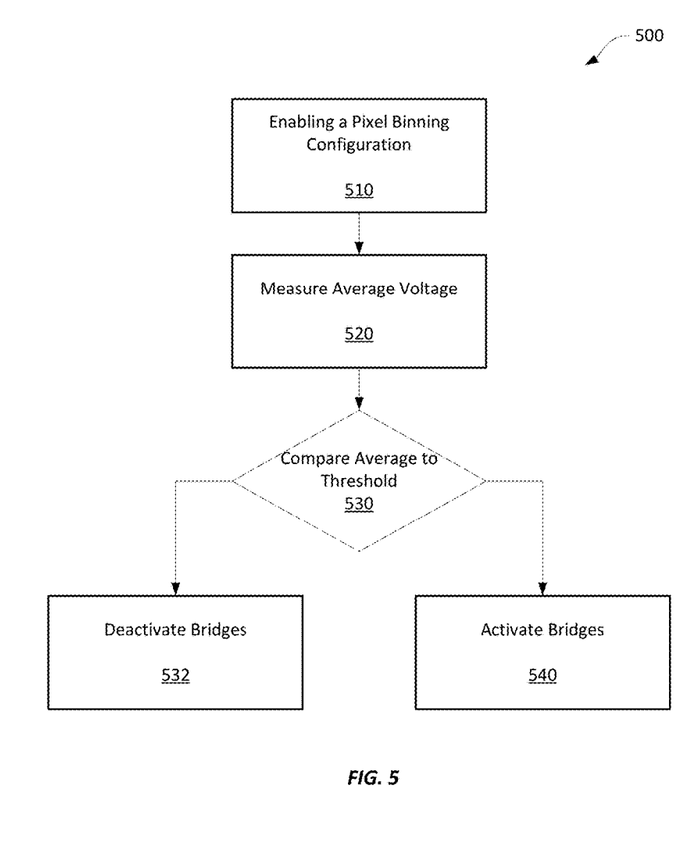
FIG. 5 shows an example method for pixel-binning with configurable shared floating diffusion.

Referring now to FIG. 5, FIG. 5 shows an example method. The method of FIG. 5 will be discussed with respect to the system 300 shown in FIG. 3, but is not limited to execution by such a system. Rather any suitable system according to this disclosure may be employed. Further, it should be noted that while the method description below is described sequentially, one or more steps may be performed simultaneously, substantially simultaneously, or in different orders, in different examples according to this disclosure. The method 500 of FIG. 5 begins at block 510.

Figure 6A:
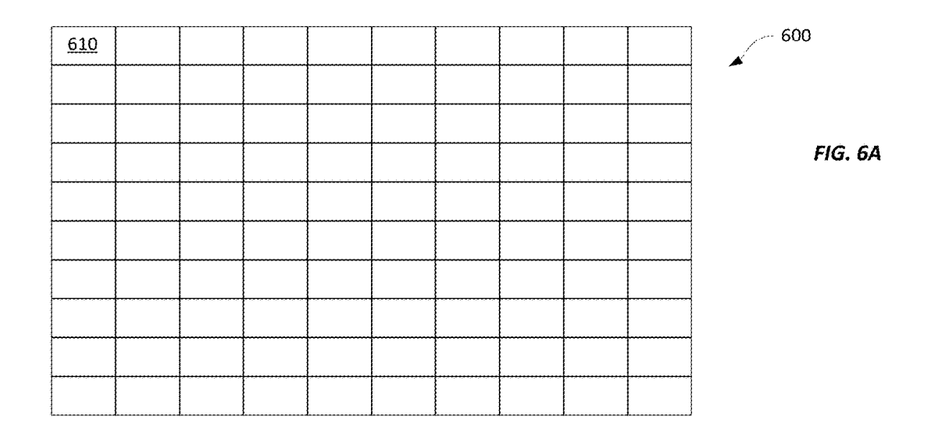
FIGS. 6A and 6B show an example of pixel binning.
Figure 6B:
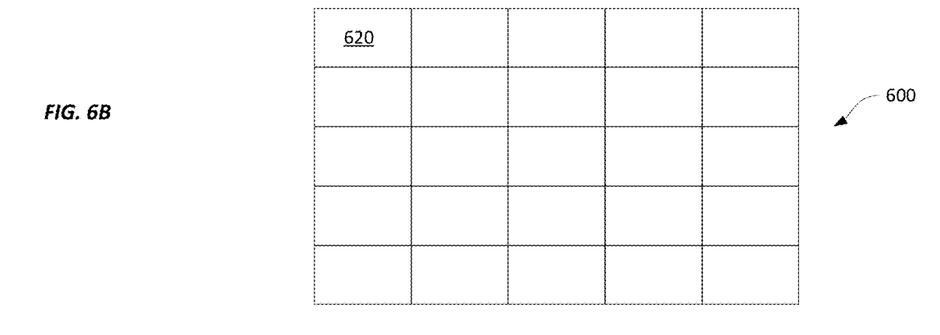

At block 510, the sensor system 310 enables a pixel binning configuration in the image sensor 312. For example, FIGS. 6A and 6B illustrate an example pixel binning configuration. FIG. 6A illustrates an arrangement of pixels 610 in an image sensor 600 without pixel binning, while FIG. 6B illustrates a set of binned pixels 620 in the image sensor 600. Each binned pixel 620 corresponds to four pixels 610, thereby reducing the resolution of the image sensor 600. In some examples, a binning configuration may be established based on a desired sensor resolution. For example, pixel bins of up to 8×8 pixels per pixel bin may be employed based on the native resolution of the image sensor 312, i.e., the resolution of the image sensor without pixel binning.

At block 520, the sensor system 310 measures a sampled indication of charge, e.g., a voltage, at one or more enabled floating diffusion regions of the binned pixel elements. For example, the sensor system 310 may read each enabled floating diffusion region and compute a mean value based on each value read from the enabled floating diffusion regions. In some examples, the sensor system 310 may only read a subset of the floating diffusion regions to determine a sampled value. In some examples, the sensor system 310 may compute other statistics related to values obtained from one or more floating diffusion regions to determine whether one or more of the floating diffusion regions are saturated or nearly-saturated with charge as a result of the pixel binning configuration.

In some examples, one or more floating diffusion regions may already be coupled by one or more bridges to form one or more shared floating diffusion regions. Thus, a measured sampled charge may be associated with a shared floating diffusion region rather than a discrete floating diffusion region.

At block 530, the sensor system 310 compares the sampled voltage that correlated with charge stored in floating diffusion region to a threshold value. If the sampled charge exceeds the threshold, the method 500 proceeds to block 540, otherwise the method 500 proceeds to block 532.

At block 532, the sensor system 310 may disable one or more enabled bridges based on the sampled voltage that correlates with charge and a second threshold value. For example, if the sampled voltage in an enabled floating diffusion region is less than a threshold, e.g., 3 volts, the sensor system 310 may determine that additional capacity created by a shared floating diffusion region is not needed and disable one or more bridges associated with the shared floating diffusion region. In some examples the sensor system 310 may determine that only one enabled bridge per floating diffusion region is needed, and transmits one or more signals to the image sensor to disable any bridges beyond one per enabled floating diffusion region. In some examples, no action may be taken at block 532, if no bridges are determined to be disabled.

At block 540, the sensor system 310 enables one or more bridges within the image sensor 312. In one example, the sensor system 312 determines a maximum voltage to be stored in a floating diffusion region and determines, for one or more floating diffusion regions, a number of bridges to be enabled to provide additional capacity in which to accumulate electric charge. For example, if a maximum voltage desired in a single floating diffusion regions is 5 volts, and the sampled voltage measured at block 520 is 12 volts, the sensor system 310 determines that an over-saturation event has occurred and that two bridges should be activated per enabled floating diffusion region. The sensor system 310 then transmits one or more signals to the image sensor 312 to enable the respective bridges.

As discussed above with respect to block 520, the sampled measured charge may be associated with a shared floating diffusion region. Thus, in some examples, if the sampled measured charge for a shared floating diffusion region exceeds a threshold, which may be a different threshold than for a single enabled floating diffusion region, a further bridge may be activated between the shared floating diffusion region and a disabled floating diffusion region to increase the capacity of the existing shared floating diffusion region. In some examples, the image sensor may restrict the number of bridges that may be employed. For example, some example image sensors may be architected to only provide one bridge coupled to each floating diffusion region, such that two floating diffusion regions are connected by one bridge, and do not have bridges to any other floating diffusion regions. However, in some examples, each floating diffusion region may be coupled to multiple other floating diffusion regions by bridges.

After completing either of blocks 532 or 540, the method 500 may end, or it may return to block 510 for another iteration.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and A and B and C.

What is claimed is:

1. An image sensor system comprising:
a plurality of sensor elements corresponding to a plurality of pixels, each sensor element corresponding to a different pixel of the plurality of pixels;
a photo-sensitive layer coupled to the plurality of sensor elements;
a plurality of floating diffusion regions in communication with the photo-sensitive layer, each floating diffusion region of the plurality of floating diffusion regions corresponding to a sensor element of the plurality of sensor elements and configured to be selectively enabled;
a plurality of bridges, each bridge coupled to two floating diffusion regions of the plurality of floating diffusion regions, the two floating diffusion regions corresponding to different pixels, each of the plurality of bridges configured to be individually and selectively enabled and, when enabled, to allow a sharing of charge between the respective two floating diffusion regions;
wherein each of the plurality of bridges is further configured to be disabled responsive to a determination that a sampled indication of charge does not exceed a threshold.

2. The image sensor system of claim 1, wherein no floating diffusion region is coupled to more than one bridge.

3. The image sensor system of claim 1, wherein one or more floating diffusion regions is coupled to more than one bridge.

4. The image sensor system of claim 1, wherein the photo-sensitive layer comprises an organic photoconductive film or a quantum dot film.

5. The image sensor system of claim 1, wherein the plurality of sensor elements are arranged as a two-dimensional array of sensor elements.

6. The image sensor system of claim 1, wherein each of the bridges comprises a transistor, wherein gating-on the transistor enables the respective bridge.

7. The image sensor system of claim 1, wherein each sensor element has a corresponding floating diffusion region.

8. The image sensor system of claim 1, wherein each sensor element of the plurality of sensor elements comprises a lens and a color filter.

9. A method comprising:
enabling a pixel binning configuration in an image sensor, the image sensor comprising:
a plurality of sensor elements corresponding to a plurality of pixels, each sensor element corresponding to a different pixel of the plurality of pixels,
a photo-sensitive layer coupled to the plurality of sensor elements,
a plurality of floating diffusion regions in communication with the photo-sensitive layer, each floating diffusion region of the plurality of floating diffusion regions corresponding to a sensor element of the plurality of sensor elements and configured to be selectively enabled, and
a plurality of bridges, each bridge coupled to two floating diffusion regions of the plurality of floating diffusion regions, the two floating diffusion regions corresponding to different pixels, each of the plurality of bridges configured to be individually and selectively enabled and, when enabled, to allow a sharing of charge between the respective two floating diffusion regions,
wherein the pixel binning configuration is established based on one or more floating diffusion regions of the plurality of floating diffusion regions being selectively disabled, and one or more bridges of the plurality of bridges being individually and selectively enabled;
measuring a sampled indication of charge at one or more enabled floating diffusion regions;
comparing the sampled indication of charge to a threshold;
responsive to determining the sampled indication of charge does not exceed the threshold, disabling one or more bridges associated with one or more of the enabled floating diffusion regions; and
responsive to determining the sampled indication of charge exceeds the threshold, enabling one or more bridges associated with one or more of the enabled floating diffusion regions.

10. The method of claim 9, wherein enabling the one or more bridges comprises:
for each enabled floating diffusion regions, enabling a bridge to a disabled floating diffusion region.

11. The method of claim 10, wherein enabling the respective bridges to the respective disabled floating diffusion regions comprises enabling only one bridge to each disabled floating diffusion region.

12. The method of claim 11, wherein a bridged enabled floating diffusion region and a disabled floating diffusion region form a shared floating diffusion region, and further comprising:
measuring a shared sampled indication of charge at one or more shared enabled floating diffusion regions;
comparing the shared sampled indication of charge to a threshold; and
responsive to determining the shared sampled indication of charge exceeds the threshold, enabling one or more bridges associated with one or more of the shared floating diffusion regions to a further disabled floating diffusion region such that the shared floating diffusion region comprises an enabled floating diffusion region and at least two disabled floating diffusion regions.

13. A non-transitory computer-readable medium comprising processor-executable instructions configured to cause a processor to:
enabling a pixel binning configuration in an image sensor, the image sensor comprising:
a plurality of sensor elements corresponding to a plurality of pixels, each sensor element corresponding to a different pixel of the plurality of pixels,
a photo-sensitive layer coupled to the plurality of sensor elements,
a plurality of floating diffusion regions in communication with the photo-sensitive layer, each floating diffusion region of the plurality of floating diffusion regions corresponding to a sensor element of the plurality of sensor elements and configured to be selectively enabled, and
a plurality of bridges, each bridge coupled to two floating diffusion regions of the plurality of floating diffusion regions, the two floating diffusion regions corresponding to different pixels, each of the plurality of bridges configured to be individually and selectively enabled and, when enabled, to allow a sharing of charge between the respective two floating diffusion regions,
wherein the pixel binning configuration is established based on one or more floating diffusion regions of the plurality of floating diffusion regions being selectively disabled, and one or more bridges of the plurality of bridges being individually and selectively enabled;
measuring a sampled indication of charge at one or more enabled floating diffusion regions;
comparing the sampled indication of charge to a threshold;
responsive to determining the sampled indication of charge does not exceed the threshold, disabling one or more bridges associated with one or more of the enabled floating diffusion regions; and
responsive to determining the sampled indication of charge exceeds the threshold, enabling one or more bridges associated with one or more of the enabled floating diffusion regions.

14. The non-transitory computer-readable medium of claim 13, wherein enabling the one or more bridges comprises:
for each enabled floating diffusion regions, enabling a bridge to a disabled floating diffusion region.

15. The non-transitory computer-readable medium of claim 14, wherein enabling the respective bridges to the respective disabled floating diffusion regions comprises enabling only one bridge to each disabled floating diffusion region.

16. An image sensor system comprising:
a plurality of means for receiving light corresponding to a plurality of pixels, each means for receiving light corresponding to a different pixel of the plurality of pixels;
means for releasing electrons in response to receiving photons coupled to the means for receiving light;
a plurality of means for accumulating electric charge coupled to the means for releasing electrons, each means for accumulating electric charge of the plurality of means for accumulating electric charge corresponding to a means for receiving light of the plurality of means for receiving light and configured to be selectively enabled;
a plurality of means for sampling an indication of charge coupled to the means for accumulating electric charge; and
a plurality of means for selectively electrically coupling two means for accumulating electric charge to allow a sharing of charge between the two means for accumulating electric charge, each of the two means for accumulating electric charge corresponding to different pixels, each of the plurality of means for selectively electrically coupling two means for accumulating electric charge configured to be individually and selectively enabled, and further configured to be selectively disabled responsive to a determination that a sampled indication of charge does not exceed a threshold.

17. The image sensor system of claim 16, wherein no means for accumulating electric charge is coupled to more than one means for selectively electrically coupling two means for accumulating electric charge.

18. The image sensor system of claim 16, wherein one or more means for accumulating electric charge is coupled to more than one means for selectively electrically coupling two means for accumulating electric charge.

19. The image sensor system of claim 16, wherein the means for releasing electrons comprises an organic photoconductive film or a quantum dot film.

20. The image sensor system of claim 16, wherein the plurality of means for receiving light are arranged as a two-dimensional array of sensor elements.

21. The image sensor system of claim 16, wherein each means for receiving light has a corresponding means for accumulating electric charge.

22. The image sensor system of claim 16, wherein each means for receiving light of the plurality of means for receiving light comprises a lens and a color filter.

* * * * *